US010109516B2

(12) United States Patent
Fosnight et al.

(10) Patent No.: US 10,109,516 B2
(45) Date of Patent: Oct. 23, 2018

(54) OVERHEAD SUBSTRATE HANDLING AND STORAGE SYSTEM

(71) Applicant: GLOBALFOUNDRIES Inc., Grand Cayman (KY)

(72) Inventors: William J. Fosnight, Saratoga Springs, NY (US); Eric Christensen, Ballston Spa, NY (US); Leslie Marshall, Saratoga Springs, NY (US); Ryan John Gallagher, Saratoga Springs, NC (US); Stephanie Waite, Saratoga Springs, NY (US); Gabriel Gaxiola, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 184 days.

(21) Appl. No.: 15/164,204

(22) Filed: May 25, 2016

(65) Prior Publication Data
US 2016/0268152 A1    Sep. 15, 2016

Related U.S. Application Data

(62) Division of application No. 13/529,264, filed on Jun. 21, 2012, now Pat. No. 9,385,019.

(51) Int. Cl.
*H01L 21/677* (2006.01)
*B65G 1/04* (2006.01)

(52) U.S. Cl.
CPC ...... *H01L 21/67733* (2013.01); *B65G 1/0464* (2013.01); *H01L 21/677* (2013.01); *B65G 2201/0297* (2013.01)

(58) Field of Classification Search
CPC ...... B65G 1/0464; B65G 1/04; B65G 1/0485; B65G 1/0457; B65G 1/0471; B65G 1/06; (Continued)

(56) References Cited

U.S. PATENT DOCUMENTS 3,990,383 A    11/1976 Omote
4,666,356 A    5/1987 Newbury
(Continued)

FOREIGN PATENT DOCUMENTS

JP    2005-308624 A    11/2005
JP    2008-263004 A    10/2008
WO    WO-2011111283 A1 *    9/2011    ....... H01L 21/67733

OTHER PUBLICATIONS

Hennessy, "Assessing the Impact of the 450mm Wafer Size Transition on Manufacturing Facility Automated Material Handling Systems," Factory Automation, Tempe, AZ.

*Primary Examiner* — Glenn F Myers
(74) *Attorney, Agent, or Firm* — Amerson Law Firm, PLLC

(57) ABSTRACT

A method for operating a material handling system including an overhead rack defining a plurality of storage positions, first and second side rails disposed above the overhead rack, a first cross rail movably coupled to the first and second side rails, and a first transport vehicle movably coupled to the first cross rail includes positioning the first transport vehicle above at least one interior window defined in the overhead rack. At least a portion of the first transport vehicle is descended through the interior window to interface with a first load port of a first tool disposed below the overhead rack. The first transport vehicle is positioned above at least one periphery window defined in the overhead rack. At least a portion of the first transport vehicle is descended through the periphery window to interface with a second load port of a second tool disposed below the overhead rack.

18 Claims, 4 Drawing Sheets

(58) Field of Classification Search
CPC ...... B65G 2201/0297; H01L 21/67733; H01L 21/67769
See application file for complete search history.

(56) References Cited

U.S. PATENT DOCUMENTS

| | | |
|---|---|---|
| 5,570,986 A | 11/1996 | Hasegawa et al. |
| 5,593,050 A | 1/1997 | Lange |
| 5,980,183 A | 11/1999 | Fosnight |
| 6,663,340 B1 | 12/2003 | Zeakes et al. |
| 6,799,521 B2 | 10/2004 | Tai et al. |
| 7,796,049 B2 | 9/2010 | Ito |
| 7,966,090 B2 | 6/2011 | Wang et al. |
| 7,972,014 B2 | 7/2011 | Shiwaku et al. |
| 7,974,040 B2 | 7/2011 | Green et al. |
| 8,139,314 B2 | 3/2012 | Green et al. |
| 8,272,827 B2 | 9/2012 | Bufano et al. |
| 8,459,442 B2 | 6/2013 | Morimoto et al. |
| 8,469,653 B2 | 6/2013 | Nave et al. |
| 8,915,690 B2 | 12/2014 | Ota |
| 9,842,756 B2 * | 12/2017 | Bonora ............. H01L 21/67766 |
| 2001/0038784 A1 | 11/2001 | Peltomaki |
| 2004/0017556 A1 | 1/2004 | Nakahara |
| 2008/0135551 A1 | 6/2008 | Yoshida et al. |
| 2008/0156618 A1 | 7/2008 | Brain |
| 2008/0217268 A1 | 9/2008 | Yoshida et al. |
| 2009/0022575 A1 | 1/2009 | Tsuge |
| 2009/0062956 A1 | 3/2009 | Chen et al. |
| 2010/0054897 A1 | 3/2010 | Bufano et al. |
| 2011/0008136 A1 | 1/2011 | Bufano et al. |
| 2012/0114453 A1 | 5/2012 | Ota et al. |
| 2012/0118845 A1 | 5/2012 | Wada |
| 2013/0199892 A1 | 8/2013 | Ota et al. |
| 2013/0259617 A1 | 10/2013 | Wang |
| 2013/0333174 A1 | 12/2013 | Babbs |

* cited by examiner

OVERHEAD SUBSTRATE HANDLING AND STORAGE SYSTEM

CROSS-REFERENCE TO RELATED APPLICATIONS

Not applicable.

BACKGROUND

The disclosed subject matter relates generally to semiconductor manufacturing and, more particularly, to an overhead substrate handling and storage system.

Growing technological requirements and the worldwide acceptance of sophisticated electronic devices have created an unprecedented demand for large-scale, complex, integrated circuits. Competition in the semiconductor industry requires that products be designed, manufactured, and marketed in the most efficient manner possible. This requires improvements in fabrication technology to keep pace with the rapid improvements in the electronics industry. Meeting these demands spawns many technological advances in materials and processing equipment and significantly increases the number of integrated circuit designs. These improvements also require effective utilization of computing resources and other highly sophisticated equipment to aid, not only design and fabrication, but also the scheduling, control, and automation of the manufacturing process.

Turning first to fabrication, integrated circuits, or microchips, are manufactured from modern semiconductor devices containing numerous structures or features, typically the size of a few micrometers or less. The features are placed in localized areas of a semiconducting substrate, and are either conductive, non-conductive, or semi-conductive (i.e., rendered conductive in defined areas with dopants). The fabrication process generally involves processing a number of wafers through a series of fabrication tools. Each fabrication tool performs one or more of four basic operations discussed more fully below. The four basic operations are performed in accordance with an overall process to finally produce the finished semiconductor devices.

Integrated circuits are manufactured from wafers of a semiconducting substrate material. Layers of materials are added, removed, and/or treated during fabrication to create the integrated, electrical circuits that make up the device. The fabrication essentially comprises the following four basic operations:

layering, or adding thin layers of various materials to a wafer from which a semiconductor is produced;
  patterning, or removing selected portions of added layers;
  doping, or placing specific amounts of dopants in selected portions of the wafer through openings in the added layers; and
  heat treating, or heating and cooling the materials to produce desired effects in the processed wafer.

Although there are only four basic operations, they can be combined in hundreds of different ways, depending upon the particular fabrication process.

To facilitate processing of wafers through a process flow, wafers are typically grouped into lots. Each lot is housed in a common wafer carrier. Carriers are transported to various process and metrology tools throughout the fabrication facility to allow the required processes to be completed to fabricate integrated circuit devices on the wafers.

Modern wafer fabrication facilities employ automated material movement systems to satisfy ergonomic concerns and to maintain a high level of automation. Interbay/intrabay vehicle automated material handling systems may be employed to automate the transfer of wafers to the tools required in the process flow. One factor contributing to the efficiency of the material handling system is the delivery time between tools. Delivery time may vary depending on the distance between tools, the congestion of the tools, and the distance an idle material handling vehicle needs to travel to pick up a waiting wafer carrier. Delivery times directly affect tool utilization and system throughput.

Due to the large number of substrates being fabricated concurrently, a large number of wafer carriers may be disposed in wafer storage areas, referred to as stockers, while they await further processing. The automated material handling system coordinates transfer of the carriers to and from the storage locations and between the various processing and metrology tools. Moves to and from storage interrupt the process flow of the substrates and also add to material handling system congestion and delay.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for operating a material handling system including an overhead rack defining a plurality of storage positions, first and second side rails disposed above the overhead rack, a first cross rail movably coupled to the first and second side rails, and a first transport vehicle movably coupled to the first cross rail, including positioning the first cross rail and the first transport vehicle above at least one interior window defined in the overhead rack. At least a portion of the first transport vehicle is descended through the at least one interior window to interface with a first load port of a first tool disposed below the overhead rack. The first cross rail and the first transport vehicle are positioned above at least one periphery window defined in the overhead rack. At least a portion of the first transport vehicle is descended through the at least one periphery window to interface with a second load port of a second tool disposed below the overhead rack.

Another aspect of the disclosed subject matter is seen in a method for operating a material handling system including an overhead rack defining a plurality of storage positions, first and second side rails disposed above the overhead rack, a first cross rail movably coupled to the first and second side rails, a first transport vehicle movably coupled to the first cross rail, a first overhead rail disposed outside of the overhead rack parallel to the first and second side rails, and a second transport vehicle movably coupled to the first overhead rail. The method includes positioning the first cross rail and the first transport vehicle above at least one interior window defined in the overhead rack. At least a portion of the first transport vehicle is descended through the at least one interior window. At least a portion of the second transport vehicle is descended below the overhead rack to access a load port of a first tool disposed below the overhead rack.

Yet another aspect of the disclosed subject matter is seen in a method for operating a material handling system including an overhead rack defining a plurality of storage positions, wherein the overhead rack defines at least one interior window devoid of storage locations and at least one periphery window along an edge of the overhead rack, first and second side rails disposed above the overhead rack, a first cross rail movably coupled to the first and second side rails to allow movement of the first cross rail in a first direction along the first and second side rails, a first transport vehicle movably coupled to the first cross rail and operable to move in a second direction perpendicular to the first direction along the first cross rail, a first overhead rail disposed outside of the overhead rack parallel to the first and second side rails, and a second transport vehicle movably coupled to the first overhead rail. The method includes positioning the first cross rail and the first transport vehicle at a first position above at least one interior window defined in the overhead rack. The first transport vehicle is descended below the overhead rack through the interior window. The first cross rail and the first transport vehicle are positioned at a second position above at least one periphery window defined in the overhead rack. The first transport vehicle is descended below the overhead rack through the periphery window. The second transport vehicle is descended below the overhead rack to access a load port of a tool disposed below the overhead rack. An input/output port position defined in the overhead rack is accessed with the first and second transport vehicles.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
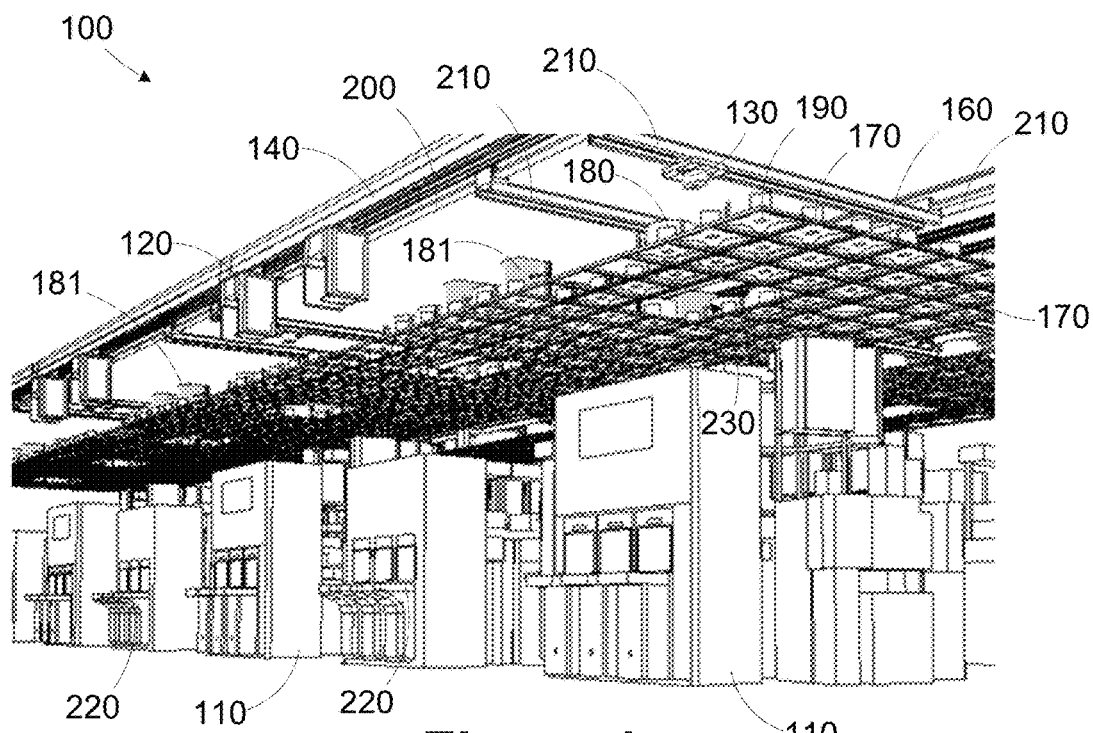
FIGS. 1-3 are isometric views of a matric material handling system.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
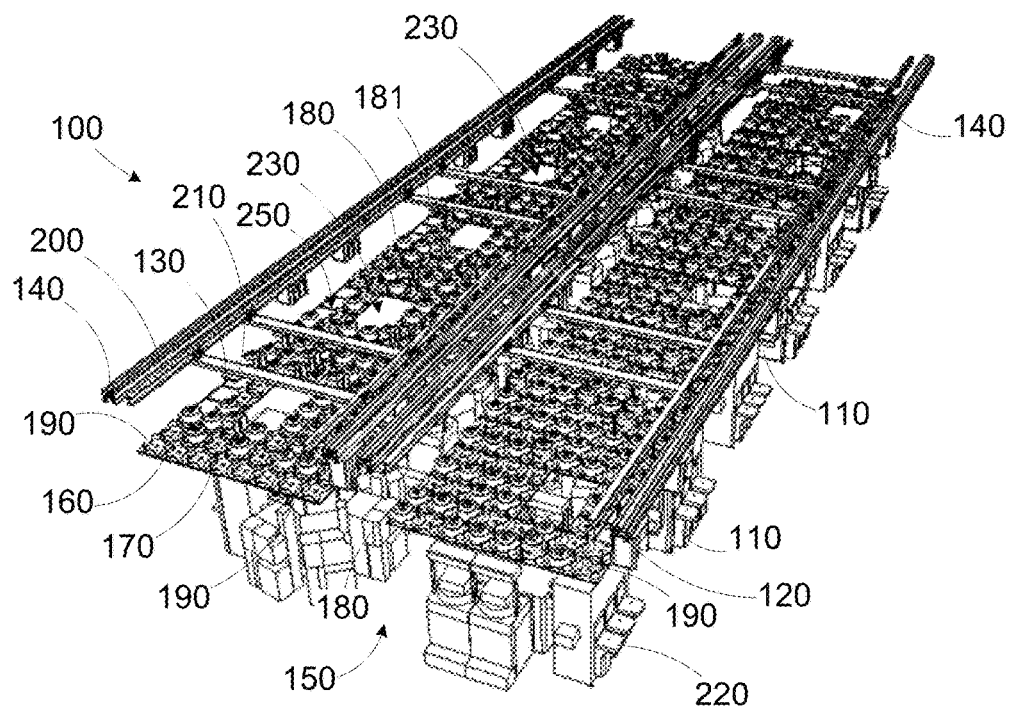
Figure 3:
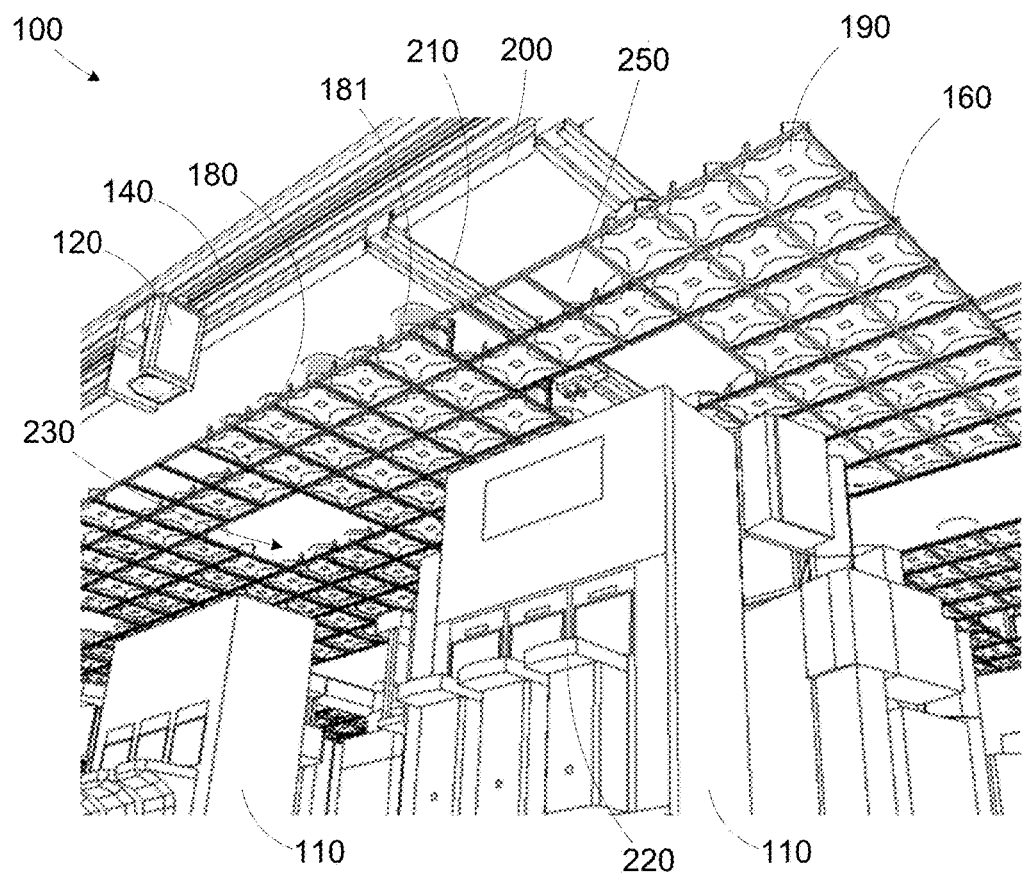
Figure 4:
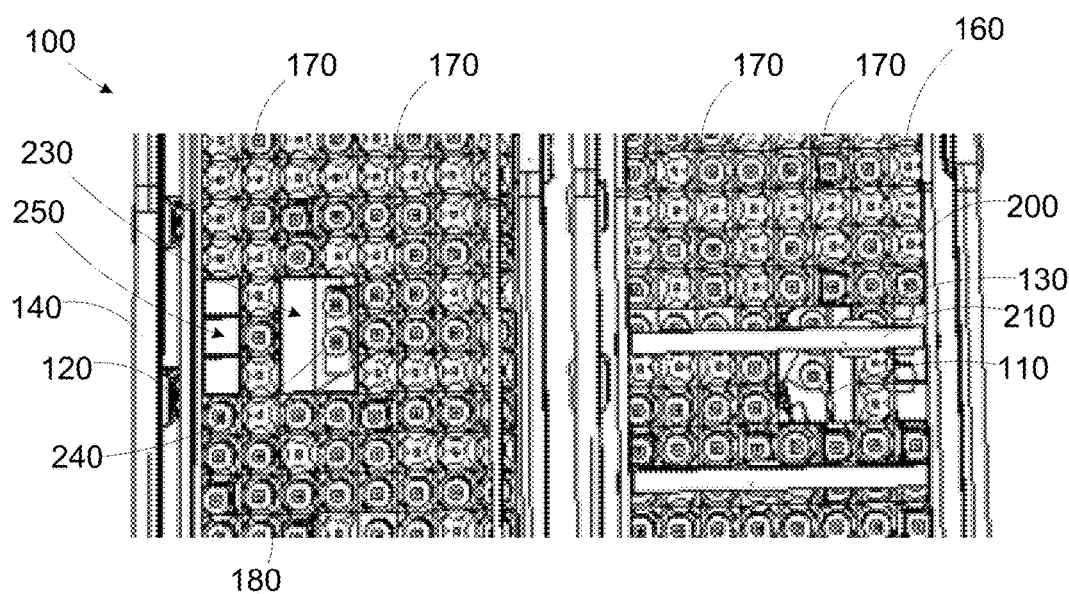
FIG. 4 is a top view of the matrix material handling system of FIG. 1.

Referring now to the drawings wherein like reference numbers correspond to similar components throughout the several views and, specifically, referring to FIGS. 1-5, the disclosed subject matter shall be described in the context of a matrix material handling system (MMHS) 100. FIGS. 1-3 are various isometric views of the MMHS 100, and FIG. 4 is a top view of the MMHS 100. The MMHS 100 is disposed over a plurality of manufacturing tools 110, such as tools used in the fabrication of semiconductor devices. In a semiconductor fabrication environment, exemplary manufacturing tools 110 include processing tools (e.g., photolithography steppers, etch tools, deposition tools, polishing tools, rapid thermal processing tools, implantation tools, etc.), metrology tools, sorters, etc.

The particular tools 110 disposed below the MMHS 100, and their arrangement may vary depending on the particular implementation and the processing steps being performed. In one example, tools 110 in a common tool family may be grouped in common control areas. Hence, photolithography tools may be located in one control area, while etch tools may be located in another control area. In another example, the tools 110 may be grouped by process layer. Hence, the tools required to form a particular layer (i.e., starting with a photolithography step and terminating prior to the next photolithography step) may be grouped into a common control area.

The MMHS 100 includes one or more linear material handling vehicles 120 and one or more matrix material handling vehicles 130. Generally, the linear material handling vehicles 120 move along overhead rails 140 disposed in aisles 150 between the tools 110. An overhead rack 160 defines a plurality of storage positions 170 over the tools 110 for receiving wafer pods 180. The linear material handling vehicles 120 move wafer pods 180 between different areas of a manufacturing facility, to one of the tools 110, or to one of the storage positions 170 in the overhead rack 160. For example, predefined input/output (I/O) port positions 190 may be defined along the periphery of the overhead rack 160 to receive or dispatch pods 180 from or to the overhead rack 160. In one embodiment, an I/O port 190 may be provided on each side of the overhead rack 160.

Figure 5:
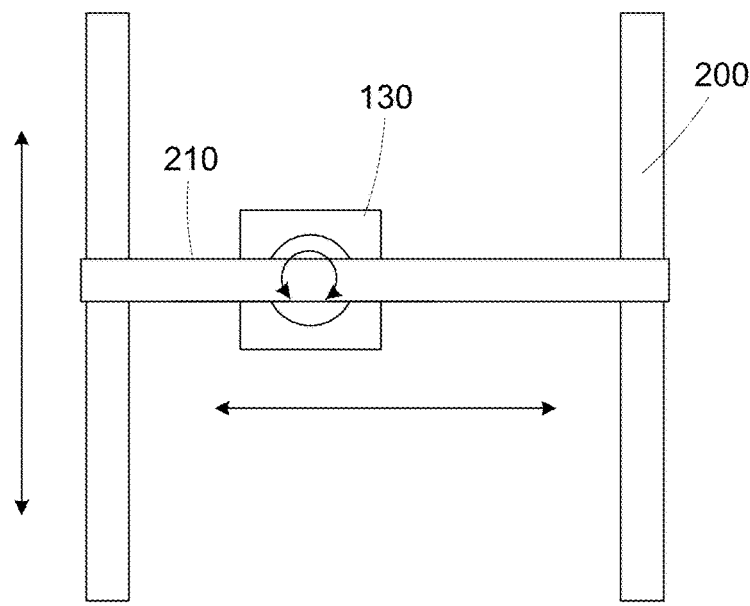
FIG. 5 is a top view of a matrix material handling vehicle in the system of FIGS. 1-5.

The matrix material handling vehicles 130 move pods 180 to various positions within the overhead rack 160 or to one of the tools 110. The matrix material handling vehicles 130 are movably coupled to a gantry drive system including side rails 200 and a cross rail 210, as shown in FIG. 5. The cross rail 210 includes a drive mechanism for moving along the side rails 200, and the matrix material handling vehicles 130 include a drive mechanism for moving along the cross rail 200 to access the various storage positions 170. The linear material handling vehicles 120 and the matrix material handling vehicles 130 also include hoist systems for raising or lowering the pods 180 to engage the overhead rack 160 or to interface with a load port 220 of one of the tools 110.

Drive systems for moving the vehicles 120, 130 along the rails 140, 200, 210 and hoist systems for raising and lowering the pods 180 to interface with the overhead rack 160 or the tools 110 are known to those of ordinary skill in the art, so they are not described in greater detail herein to avoid obscuring the present subject matter.

Figure 6:
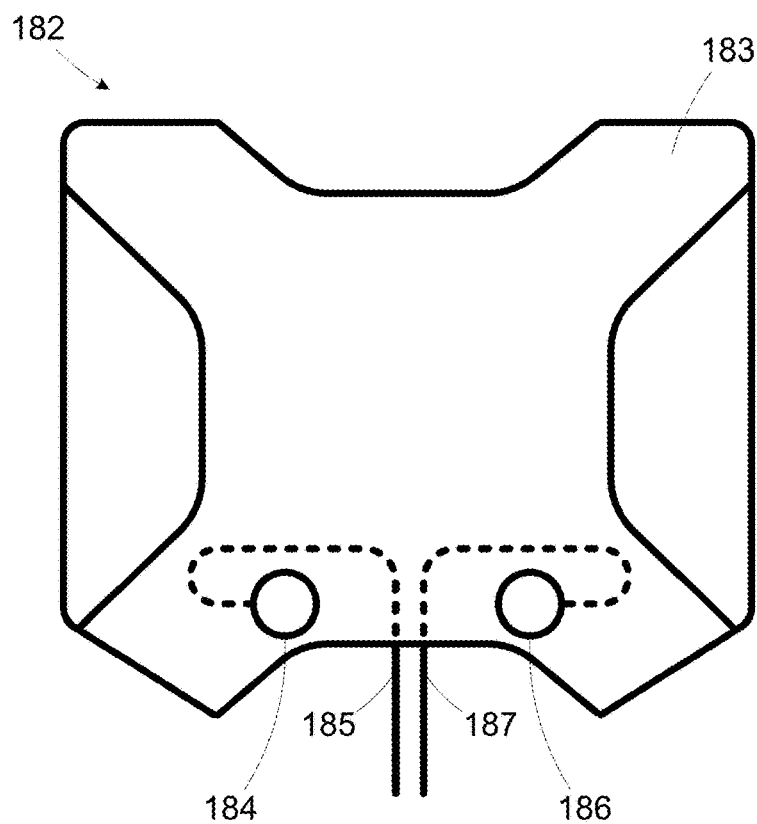
FIG. 6 is a diagram of a purge nest for controlling the environment of a wafer pod in the matrix material handling system of FIGS. 1-5.

Certain storage positions 181 may be equipped with equipment to establish a vacuum and/or to provide nitrogen gas, extremely clean dry air (XCDA), or some other purge gas) for pods 180 stored therein. These pods 180 may be stored under protected conditions (e.g., to avoid oxidizing exposed regions of the wafers) near the tools 110 needed for the next process operation. This protected storage near the tool 110 increases throughput and yield. An exemplary storage location 181 equipped with a purge nest 182 is shown in FIG. 6. The purge nest 182 includes a frame 183 for supporting a wafer pod 180. A purge port 184 fed by a gas supply line 185 is provided to supply a cover gas for the interfacing pod 180 (not shown). A vacuum port 186 coupled to a vacuum line 187 may be used to remove the purge gas exiting the pod 180.

The overhead rack 160 defines one or more interior windows 230 to allow a matrix material handling vehicle 130 to interface with a load port 240 of a tool not disposed along the periphery of the overhead rack 160 (i.e., along an aisle 150). The matrix material handling vehicle 130 may be provided with rotating grippers to allow a wafer pod 180 to be rotated as well as lowered, so that the pod 180 may be aligned at any angle (e.g., aligned with various cluster tool facets). The overhead rack 160 also defines periphery windows 250 to allow access to the aisle-oriented load ports 220.

The overhead rack 160 may be constructed of a plurality interlocking grid pieces that can be dynamically configured to arrange the windows 230 relative the load ports 240. For tools 110 that are susceptible to particulate contamination (e.g., while they are opened during preventative maintenance procedures), a fan filter unit (FFU) containing a high efficiency particulate air (HEPA) filter may be mounted immediately beneath the overhead rack 160. For tools 110 that have utilities or exhaust ducts passing through the ceiling, the utilities and exhaust may be grouped to penetrate an interior window 230 selectively placed in the matrix, or grouped adjacent to the overhead rack 160 so as to not inhibit the travel of the matrix material handling vehicles 130 over tool load ports 220.

Either the linear material handling vehicles 120 or the matrix material handling vehicles 130 can access the aisle-oriented load ports 220 to load the tools 110. Generally, a linear material handling vehicle 120 lowers the pod 180 and reaches out to engage the load port 220, while the matrix material handling vehicle 130 traverses through the periphery window 250 to engage the pod 180 with the load port 220.

Figure 7:
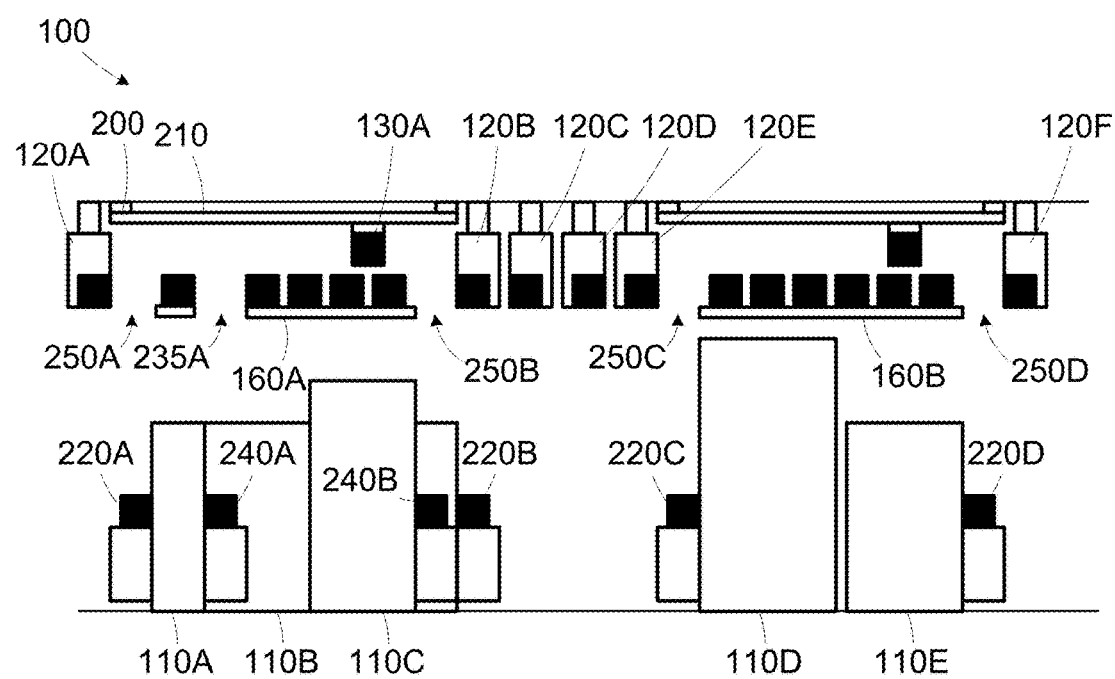
FIG. 7 is a cut-away side view of the matrix material handling system of FIGS. 1-5.

FIG. 7 illustrates a cut-away side view of the MMHS 100 illustrating how tool density may be increased due to the overhead and matrix vehicles 120, 130. In the embodiment illustrated in FIG. 7, the system 100 includes linear material handling vehicles 120A-F and matrix material handling vehicles 130A-B. The inside linear material handling vehicles 120C, 120D may be provided to allow traffic to bypass the illustrated portion of the MMHS 100. The linear material handling vehicles 120A, 120B, 120E, 120F may be used to load tools 110A-E or to transfer pods 180 in to and out of their respective portions of the overhead rack 160A, 160B. The tools 110A-E may be arranged with load ports 220A-D that are disposed on edges of the MMHS 100 and load ports 240A, 240B that are disposed not on the edges. Interior windows 235A-B and periphery windows 250A-D are provided to allow the matrix material handling vehicles 130A-B to access the various load ports 220A-D, 240A-B.

For example, the load port 220A disposed along the edge may be accessed by the linear material handling vehicle 120A or by the matrix material handling vehicle 130A through the periphery window 250A. The load port 240A that is not disposed along the edge may be accessed by the matrix material handling vehicle 130A through the interior window 235A. The layout of the tools 110A-E may be varied depending on the amount of available floor space and the size and port positions of the tools to improve the density of the layout.

Because the matrix material handling vehicle 130 can interface with a tool 110 through an interior window 230, the tools 110 need not be arranged in a completely linear fashion, as is the case in a conventional machine layout. Because the size and port orientation of the various tools 110 may vary, avoiding a linear layout allows a denser tool layout, thereby conserving floor plan space to increase fab capacity and reducing the traversal distance between tools 110 to increase throughput. Due to the number of storage positions 170 in the overhead rack 160 conventional stockers need not be provided in the MMHS 100, thereby reducing overall system cost and increasing throughput by avoiding moves to and from the stockers.

In one embodiment, the tools 110 disposed along the aisles 150 may be provided with conventional SEMI ports 240 for receiving conventional front opening unified pods (FOUP). These conventional ports 240 may be accessed by either the linear material handling vehicles 120 or the matrix material handling vehicles 130. Tools 110 disposed near the interior windows 230 may be provided with advanced ports for receiving advanced wafer pods. For example, pods 180 may be provided that do not open to external atmosphere for loading or unloading. A protective gas may be provided during the transfer operation. The advanced load port may be provided for a cluster tool 110, a carrier capable of directly interfacing with a vacuum, etc. The use of advanced pods allows direct process to process moves, which increased both yield and throughput. These direct moves also eliminates the need for FOUP handling steps, thereby reducing hardware requirements and improving cycle times.

The overhead rack 160 may be shared by more than one matrix material handling vehicle 130. For example, as shown in FIG. 2, four or more cross rails 200 may be provided over the rack 160, each with its own matrix material handling vehicle 130. Shared regions may be defined in the overhead rack 160 that can be accessed by different matrix material handling vehicles 130. One matrix material handling vehicle 130 can place a pod 180 in a storage position 170 after processing by a tool 110, and another matrix material handling vehicle 130 can retrieve the pod 180 at a later time to move it to a different tool 110 for the next operation. If one matrix material handling vehicle 130 fails, another matrix material handling vehicle 130 can bump the cross rail 200 out of the way to access storage positions 170 in the overhead rack 160 that had been serviced by the failed matrix material handling vehicle 130.

The MMHS 100 eliminates single points of failures because the overhead rack 160 can be loaded from by the linear material handling vehicles 120 using overhead rails 140 on either side. In cases where there is no failure, this effectively doubles the throughout density. Overlapping portions of the overhead rack 160 may be accessed by different matrix material handling vehicle 130. The two-dimensional capabilities of the matrix material handling vehicles 130 also allow fast swapping at the tools 110 and access to tools 110 disposed beneath the overhead rack 160. Traffic blockages associated with conventional linear material handling systems may be avoided due to the increased number of movement axes.

The proximity of the overhead rack 160 to the tools 110 allows shared local buffering for tools 110 of the same type. Multiple pods 180 requiring the same operation may be stored proximate tools 110 of the same type without requiring the scheduling system to identify the particular tool 110 that will perform the next operation. The matrix material handling vehicles 130 may deliver the pod 180 to the selected tool 110 after the dispatch decision is made without incurring a material handling delay. Kits of test wafers may also be stored proximate to tools 110 where they may be employed (e.g., to qualify a tool after maintenance) to save cycle time and reduce material handling traffic.

Scheduling for the MMHS 100 may be provided by centralized and local schedulers. A centralized scheduler schedules global moves within the system 100, while local controllers control moves for pods 180 stored on the overhead rack 160 for a group of tools 110 to effect the processing of the wafers over a plurality of process steps. An exemplary scheduling system is described in U.S. patent application Ser. No. 13/247,792, entitled "Methods and Systems for Semiconductor Fabrication with Local Processing Management", and incorporated herein by reference in its entirety.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method for operating a material handling system including an overhead rack defining a plurality of storage positions, first and second side rails disposed above said overhead rack, a first cross rail movably coupled to said first and second side rails, and a first transport vehicle movably coupled to said first cross rail, comprising:
    positioning said first cross rail and said first transport vehicle above at least one interior window defined in said overhead rack;
    descending at least a portion of said first transport vehicle through said at least one interior window to interface with a first load port of a first tool disposed below said overhead rack;
    positioning said first cross rail and said first transport vehicle above at least one periphery window defined in said overhead rack; and
    descending at least a portion of said first transport vehicle through said at least one periphery window to interface with a second load port of a second tool disposed below said overhead rack.

2. The method of claim 1, further comprising interfacing a pod coupled to said first transport vehicle with said first load port.

3. The method of claim 2, further comprising rotating said pod using said first transport vehicle to align said pod with said first load port.

4. The method of claim 1, further comprising interfacing a pod coupled to said first transport vehicle with said second load port.

5. The method of claim 1, wherein said material handling system includes a first overhead rail disposed along a first edge of said overhead rack parallel to said first and second side rails, a second transport vehicle movably coupled to said first overhead rail, a second overhead rail disposed along a second edge of said overhead rack parallel to said first and second side rails, and a third transport vehicle movably coupled to said first overhead rail, and the method further comprises:
    positioning said second transport vehicle to engage a first pod disposed at a first input/output port position defined in said overhead rack along said first edge; and
    positioning said third transport vehicle to engage a second pod disposed at a second input/output port position defined in said overhead rack along said second edge.

6. The method of claim 1, wherein said material handling system includes a second cross rail movably coupled to said first and second side rails and a second transport vehicle movably coupled to said second cross rail, and the method further comprises engaging said first cross rail with said second cross rail to push said first cross rail along said first and second cross rails.

7. The method of claim 1, wherein said material handling system includes a purge nest disposed on said overhead rack and having at least one gas port, and the method further comprises engaging said gas port with a pod supported by said overhead rack.

8. The method of claim 7, wherein engaging said gas port further comprises providing a purge gas to said pod.

9. A method for operating a material handling system including an overhead rack defining a plurality of storage positions, first and second side rails disposed above said overhead rack, a first cross rail movably coupled to said first and second side rails, a first transport vehicle movably coupled to said first cross rail, a first overhead rail disposed outside of said overhead rack parallel to said first and second side rails, and a second transport vehicle movably coupled to said first overhead rail, comprising:

positioning said first cross rail and said first transport vehicle above at least one interior window defined in said overhead rack;

descending at least a portion of said first transport vehicle through said at least one interior window to interface with a first load port of a first tool disposed below said overhead rack; and descending at least a portion of said second transport vehicle below said overhead rack to access a second load port of a second tool disposed below said overhead rack.

10. The method of claim 9, further comprising descending at least a portion of said first transport vehicle through at least one periphery window defined in said overhead rack to interface with a third load port of a third tool disposed below said overhead rack.

11. The method of claim 9, further comprising interfacing a pod coupled to said first transport vehicle with said second load port.

12. The method of claim 11, further comprising rotating said pod using said first transport vehicle to align said pod with said second load port.

13. The method of claim 10, further comprising interfacing a pod coupled to said first transport vehicle with said third load port.

14. The method of claim 9, wherein said material handling system includes a first overhead rail disposed along a first edge of said overhead rack parallel to said first and second side rails, a third transport vehicle movably coupled to said first overhead rail, a second overhead rail disposed along a second edge of said overhead rack parallel to said first and second side rails, and a fourth transport vehicle movably coupled to said first overhead rail, and the method further comprises:

positioning said third transport vehicle to engage a first pod disposed at a first input/output port position defined in said overhead rack along said first edge; and positioning said fourth transport vehicle to engage a second pod disposed at a second input/output port position defined in said overhead rack along said second edge.

15. The method of claim 9, wherein said material handling system includes a second cross rail movably coupled to said first and second side rails and a third transport vehicle movably coupled to said second cross rail, and the method further comprises engaging said first cross rail with said second cross rail to push said first cross rail along said first and second cross rails.

16. The method of claim 9, wherein said material handling system includes a purge nest disposed on said overhead rack and having at least one gas port, and the method further comprises engaging said gas port with a pod supported by said overhead rack.

17. The method of claim 16, wherein engaging said gas port further comprises providing a purge gas to said pod.

18. A method for operating a material handling system including an overhead rack defining a plurality of storage positions, wherein said overhead rack defines at least one interior window devoid of storage locations and at least one periphery window along an edge of said overhead rack, first and second side rails disposed above said overhead rack, a first cross rail movably coupled to said first and second side rails to allow movement of said first cross rail in a first direction along said first and second side rails, a first transport vehicle movably coupled to said first cross rail and operable to move in a second direction perpendicular to said first direction along said first cross rail, a first overhead rail disposed outside of said overhead rack parallel to said first and second side rails, and a second transport vehicle movably coupled to said first overhead rail, comprising:

positioning said first cross rail and said first transport vehicle at a first position above at least one interior window defined in said overhead rack;

descending said first transport vehicle below said overhead rack through said interior window to interface with a first load port of a first tool disposed below said overhead rack;

positioning said first cross rail and said first transport vehicle at a second position above at least one periphery window defined in said overhead rack;

descending said first transport vehicle below said overhead rack through said periphery window;

descending said second transport vehicle below said overhead rack to access a second load port of a second tool disposed below said overhead rack; and accessing an input/output port position defined in said overhead rack with said first and second transport vehicles.

\* \* \* \* \*